US 6,686,230 B2

(12) United States Patent
Meiling et al.

(10) Patent No.: US 6,686,230 B2
(45) Date of Patent: *Feb. 3, 2004

(54) SEMICONDUCTING DEVICES AND METHOD OF MAKING THEREOF

(75) Inventors: Hans Meiling, Bilthoven (NL); Rudolf Emmanuel Isidor Schropp, Driebergen-Rijsenburg (NL)

(73) Assignee: Debye Instituut, Universiteit Utrecht, Utrecht (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/331,528

(22) PCT Filed: Dec. 18, 1997

(86) PCT No.: PCT/EP97/07195

§ 371 (c)(1),
(2), (4) Date: Aug. 5, 1999

(87) PCT Pub. No.: WO98/28463

PCT Pub. Date: Jul. 2, 1998

(65) Prior Publication Data

US 2002/0132411 A1 Sep. 19, 2002

(30) Foreign Application Priority Data

Dec. 23, 1996 (NL) .............................. 1004886

(51) Int. Cl.⁷ ..................... H01L 21/84; H01L 21/324
(52) U.S. Cl. ................. 438/158; 438/162; 438/798; 438/908; 438/910
(58) Field of Search ................. 438/158, 162, 438/798, 908, 910

(56) References Cited

U.S. PATENT DOCUMENTS 4,237,151 A     12/1980   Strongin et al.
4,465,706 A   *   8/1984   Dalal et al. ................... 427/86

(List continued on next page.)

FOREIGN PATENT DOCUMENTS

DE    43 33 416       4/1995
EP    0 687 753      12/1995

OTHER PUBLICATIONS

Meiling H. et al., "Stability of hot–wire deposited amorphous–silicon thin–film transistors", Applied Physics Letters, Aug. 19, 1996, AIP, USA, vol. 69, No. 8, ISSN 0003–6951, pp. 1062–1064, XP000626137.

Kikuo Ono et al., "Inverse–Staggered Polycrystalline Silicon Thin–Film Transistors Fabricated By Excimer Laser Irradiation", Electronics & Communications In Japan, Part II—Electronics, vol. 76, No. 12, Dec., 1993, pp. 40–46, XP000468568.

(List continued on next page.)

*Primary Examiner*—Wael Fahmy
*Assistant Examiner*—Steven H. Rao
(74) *Attorney, Agent, or Firm*—Frommer Lawrence & Haug, LLP; William S. Frommer; Matthew K. Ryan

(57) ABSTRACT

A process for providing a semiconducting device including the steps of depositing a semiconducting layer onto a substrate by means of heating a gas to a predetermined dissociation temperature so that the gas dissociates into fractions, whereby those fractions subsequently condense on the substrate to build up a semiconducting layer.

21 Claims, 3 Drawing Sheets

U.S. PATENT DOCUMENTS

| | | | | |
|---|---|---|---|---|
| 4,485,128 A | * | 11/1984 | Dalal et al. | 427/85 |
| 4,589,006 A | * | 5/1986 | Hansen et al. | 357/29 |
| 4,634,605 A | * | 1/1987 | Wiesmann | 427/249 |
| 4,747,077 A | | 5/1988 | Hockley et al. | |
| 5,281,546 A | | 1/1994 | Possin et al. | |
| 5,397,737 A | * | 3/1995 | Mahan et al. | 437/101 |
| 5,500,047 A | * | 3/1996 | Park et al. | |
| 5,776,819 A | * | 7/1998 | Mahan et al. | 438/482 |
| 5,798,137 A | * | 8/1998 | Lord et al. | 427/213 |

OTHER PUBLICATIONS

Doyle R. et al., "Production of high–quality amorphous silicon films by evaporative silane surface decomposition", Journal of Applied Physics, Sep. 15, 1988, USA, vol. 64, No. 6, ISSN 0021–8979, pp. 3215–3223, XP000097188.

Japanese Abstract of 01–162769, dated Jun. 27, 1989; Araki Makoto; Formation of Amorphous Silicon.

* cited by examiner

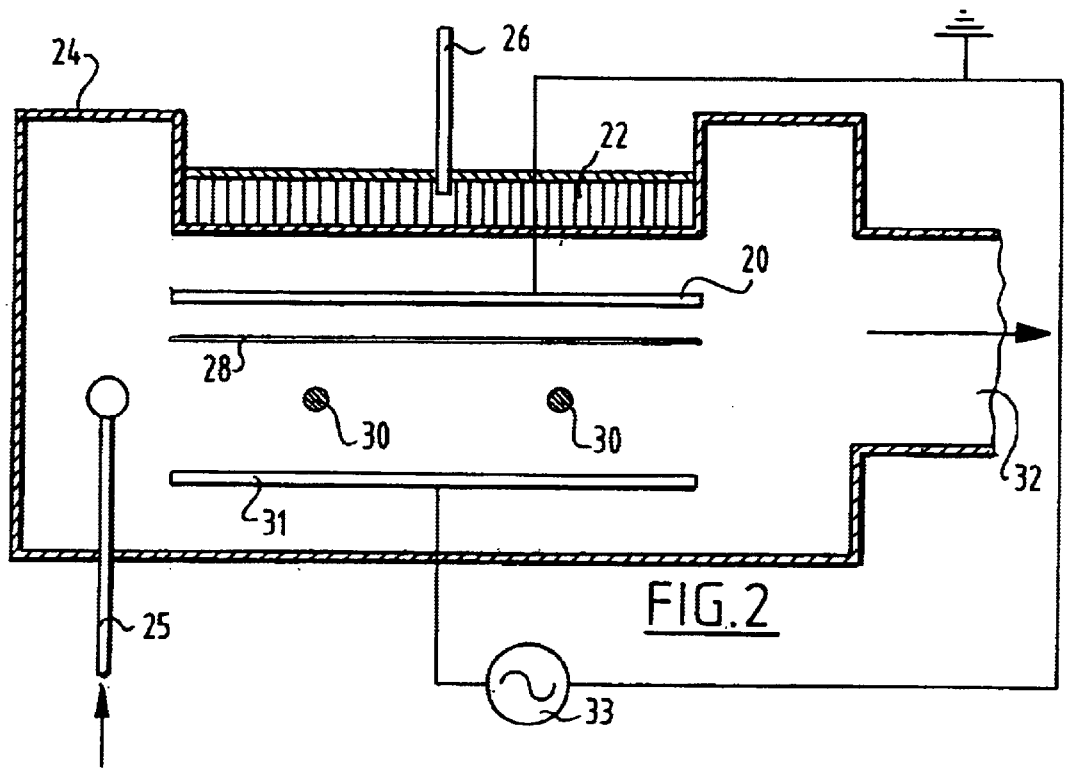
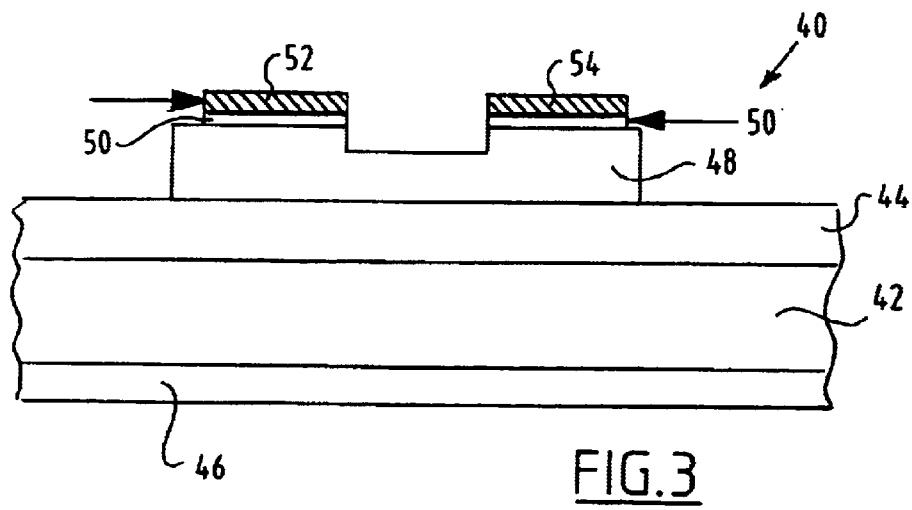

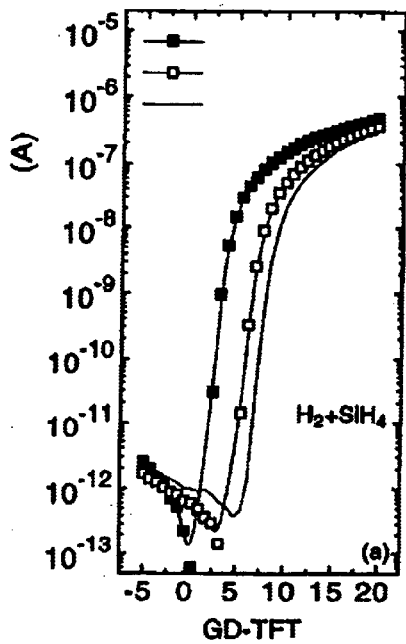
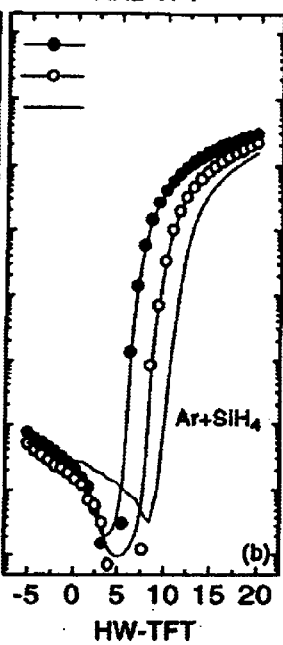
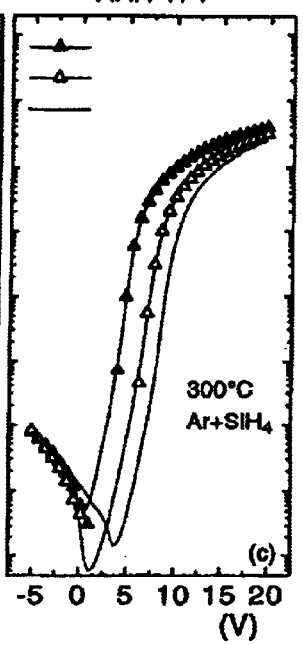
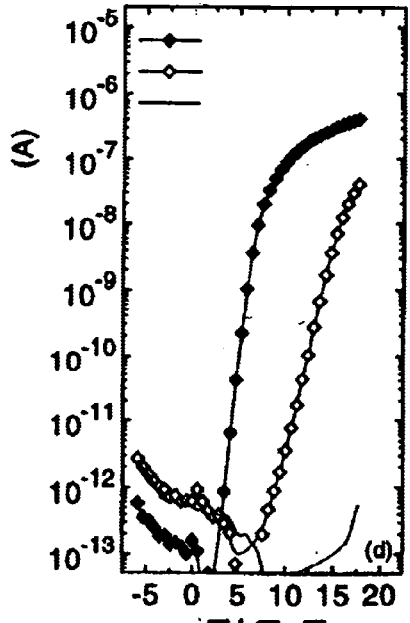
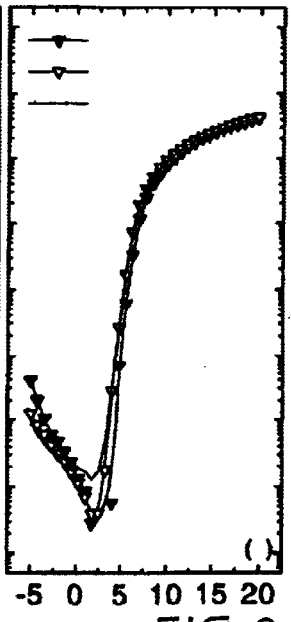

SEMICONDUCTING DEVICES AND METHOD OF MAKING THEREOF

The present application relates to a process for providing semiconducting devices, in particular transistors and solar cells and to the devices obtainable by such a process.

Semiconducting devices have a wide variety of applications. For example thin film transistors, TFTs incorporating amorphous silicon or polycrystalline silicon are employed as current switching devices in applications such as the active matrix of liquid crystal displays.

A thin-film transistor 40 (FIG. 3) is in its most simple form a three-terminal device, i.e. it has three separate metal contacts.

An example of the TFT composition is as follows: a flat wafer 42 made of highly doped crystalline silicon is thermally oxidized on one face. The oxide layer 44 is a non-conducting or insulating layer. Alternative materials, including but not limited to silicon nitride or silicon oxy-nitride, can also function as the insulator. On the opposing face of the wafer a metal contact is applied, the gate contact 46. Then a semiconducting material, e.g. poly-crystalline silicon or silicon or hydrogenated amorphous silicon (α-Si:H), is applied to the side of the wafer where the insulator is present 48. On top of this semiconducting layer 48 a second silicon layer 50, which contains dopant atoms such as phosphorus or boron, is applied. Then on top of this, two metal contacts for the source 52 and drain 54 are applied adjacent to each other with a set and fixed distance between them. The highly conductive lastly applied silicon layer is removed from between the source and drain contacts, hence creating a semi-insulating path between these contacts.

When a voltage is applied to the gate contact a highly conductive sublayer is created in the semiconductor, parallel to and spatially adjacent to the interface of the insulator and semiconductor. This layer is called the channel of the TFT and is typically 50 Ångstrom to 200 Ångstrom thick. The effect of enhanced conductivity upon application of a voltage to the gate electrode is the field effect. When an electric field is present between the source and drain, current conduction through the TFT takes place from the source to the interface, then laterally along the interface if a voltage is applied to the gate, and out perpendicular to the said interface through the drain.

In thin-film transistors based on hydrogenated amorphous silicon, a shift to higher voltages at the onset of current conduction (the threshold voltage) is commonly observed upon prolonged application of a positive voltage to the gate terminal of the device. Also a deterioration of the subthreshold slope is observed. When a negative voltage is applied, a shift of the threshold voltage is also observed.

Conventional techniques for depositing a semiconducting layer onto a substrate include the so-called radiofrequency glow discharge technique at 13.56 MHz (a form of plasma enhanced chemical vapour deposition) and also at higher excitation frequencies in the range of 13.56 MHz to 150 MHz.

A problem of α-Si:H in electronic devices such as solar cells, diodes, and TFTs, is its metastable behavior upon application of a continuous voltage to one of the electrodes or to the gate electrode of TFTs and upon illumination with light.

For example in flat screen televisions comprising an active matrix, where the screens consist of a number of pixels, each pixel has a transistor which can be switched on and off to allow light to pass through, whereby the clarity of the image can be controlled. Transistors incorporating α-Si:H as the semiconducting material exhibit an increase in gate threshold voltage to achieve the same current, sometimes after only a half hour.

Furthermore, light illumination of a solar cell causes the creation of electronic defects which results in deterioration of the device performance.

These effects are reversible, for instance when the device is heated to about 150° C., the original device characteristics can be re-obtained. However this heat treatment is neither a practical nor economical solution for the many applications comprising these devices.

In thin film transistors incorporating an α-Si:H semiconducting layer, the creation of electronic defects is caused by a continuous voltage applied to the gate contact. A shift in the gate voltage at the onset of current conduction, the so-called threshold voltage, is generally observed, even after only a few minutes of gate voltage application. This means that after several minutes of operation, a higher voltage is required to turn on the transistor, which results in the unwanted effect of drift in the operational characteristics. This effect is illustrated in FIGS. 4 and 7. In FIG. 4 the characteristics are shown for a TFT with the α-Si:H deposited at 50 MHz, in FIG. 7 those for a 13.56 MHz TFT. The curves are for "as deposited", after 1.5 h stress, and after 2.5 h stress, respectively.

An object of the present invention is to provide improved semiconductor devices.

According to a first aspect the present invention provides a process for providing a semiconducting device comprising the steps of:

depositing a semiconducting layer onto a substrate by means of heating a gas to a predetermined, dissociation temperature so that the gas dissociates whereby fractions thereof condense on the substrate to build up a semiconducting layer.

The inventors have found that depositing a semiconducting layer onto a substrate in this manner yields a semiconducting device which exhibits substantially no shift in threshold voltage upon gate voltage application.

According to a further aspect of the present invention there is provided a device, in particular being a transistor, said device having a substantially consistent gate voltage and a saturation mobility $\mu$, in the range of about 0.001 to about 100, for example about 0.001 to about 10 and most preferably from about 0.1 to about 1.00 cm$^2$/V.s.

According to yet another aspect of the present invention, there is provided a device comprising a substantially exclusive polycrystalline Si:H or a polycrystalline and amorphous Si:H layer, said device having a substantially consistent gate voltage and a saturation mobility lying in the range of about 0.001–1000, for example 0.001 to 500 cm$^2$/V.s.

Although exhibiting a similar saturation mobility to TFT's according to the present invention, conventional TFT's still suffer from dramatically increasing threshold voltages during their working lives.

According to another aspect of the present invention, there is provided a semiconducting device obtainable according to the above process.

According to a further aspect of the present invention there is provided a vacuum chamber for carrying out the above process.

The present invention will be further elucidated by way of the following description, specific example and figures, wherein:

FIG. 1 shows a representation of a conventional method for depositing semiconducting layers;

FIG. 2 schematically shows a deposition chamber with the hot filament assembly according to the present invention;

FIG. 3 shows a schematic cross-section of a thin film transistor;

FIGS. 4–7 show graphs of the shift in threshold voltage in time of thin film transistors obtained according to the known method; and FIG. 8 shows a graph of the source drain current versus the gate voltage for a thin film transistor obtained according to the present invention.

Figure 1:
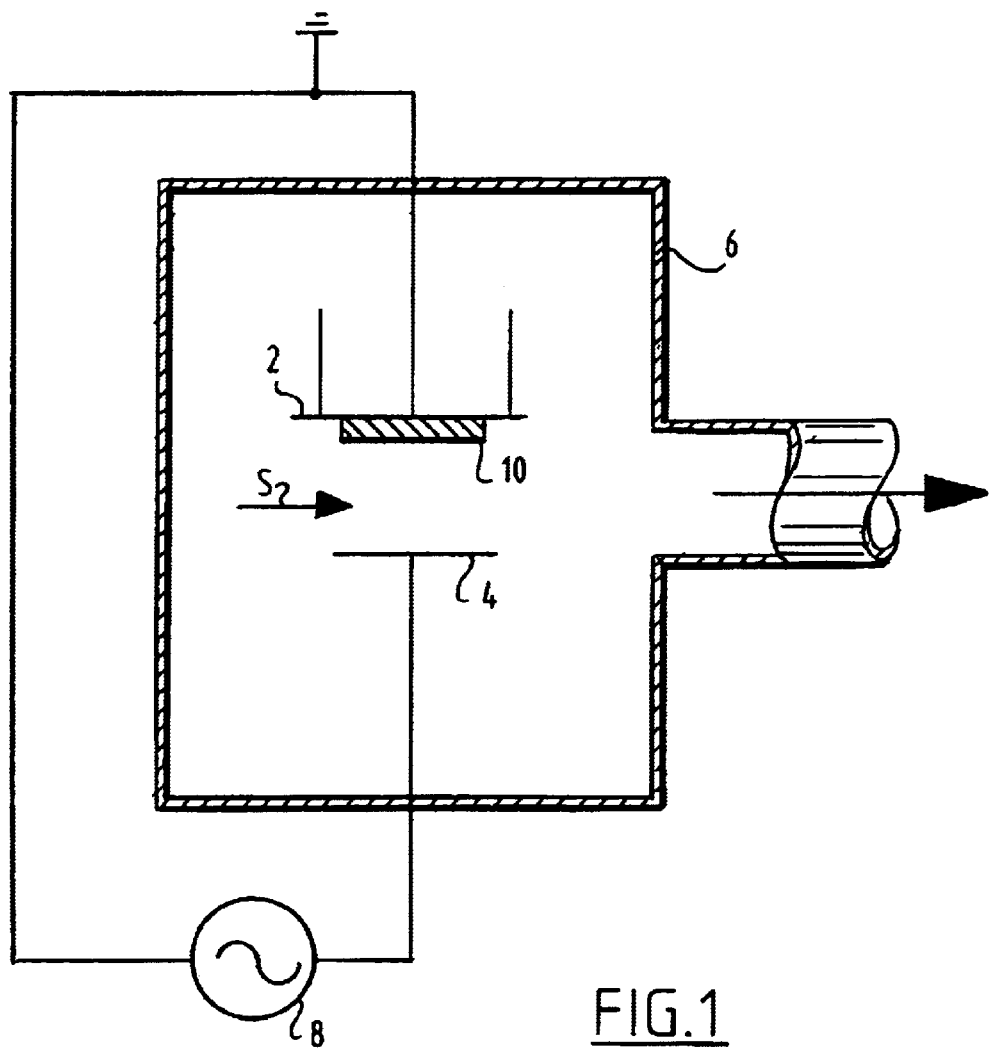

α-Si:H based thin film transistors are usually currently made using the radiofrequency plasma enhanced chemical vapour deposition (PECVD) method, in the following way. Between two metallic plates 2, 4 (FIG. 1) separated typically by 1–5 cm, a silicon containing gas S is dissociated by an alternating electric field. The plates 2, 4 are enclosed in a vacuum vessel 6. The electric field is generated by a radiofrequency generator 8 and the voltage signal typically has a frequency in the range of about 13.56 million to 150 million Hz. The radiofrequency power usually is limited to $\leq 50$ watts depending on the size of the substrate 10. On forming a semiconducting layer on the substrate 10, the silicon containing gas is guided into the vacuum vessel 6, and the radiofrequency is switched on. The substrate is heated to around 220° C., whereby the flow of the silicon containing gas is usually 30 standard $cm^3$/minute (sccm) and wherein a pressure of 0.1 to 0.5 millibar exists in the vessel 6.

FIGS. 4–7 show standard drain current versus gate voltage shift for thin film transistors obtained according to this known method.

Key to FIGS. 4–7

| | |
|---|---|
| -■-<br>-●-<br>-▲-<br>-◆-<br>-▼-<br>-□- | drain current versus gate voltage, measured at t = 0 after start of the gate voltage stress |
| -○-<br>-△-<br>-◇-<br>-▽- | drain current versus gate voltage, at t = 1½ hours after start of the gate voltage stress |
| — | drain current versus gate voltage at t = 2½ hours after start of the gate voltage stress |

Substrate Pretreatment and Semiconducting Film Deposition According to the Present Invention A deposition chamber 24 (FIG. 2) according to the present invention, comprises a gas inlet 25, two filament wires 30, a displaceable shutter element 28, a thermocouple 26, a heater 22 and a gas outlet 32 connected to a pump for pumping the gas out of the chamber.

A substrate, for example a thermally oxidized silicon wafer 20, can be arranged between the shutter and the heating element.

The thermally oxidized wafer 20 (oxide thickness is approximately 200 nanometer) is in the proximity of a heater 22 in a vacuum vessel 24. The heater 22 of the system is set to its process temperature, typically in the range of 100° C. to 600° C. and is connected to a thermocouple 26. A shutter 28 protecting the wafer 20 from contamination and from the heat of a tungsten filament 30 remains spatially inbetween the filament 30 and the wafer 20. When the wafer has reached its process temperature, the tungsten filament 30 is turned on by applying an AC or DC voltage to its terminals. Typically, an AC voltage of 10–220 Volt and a current in the range of 10 Ampere to 20 Ampere is used, depending on, e.g., the length of the said filament. The temperature of the filament then is in the range of 1600° C. to 2000° C. For at least 45 minutes the whole system remains in this condition to stabilize the wafer temperature and the temperature of all other mechanical components in the vessel. Subsequently, hydrogen gas, $H_2$, is admitted to the vacuum vessel 24, the shutter 20 is then removed from between the filament 30 and wafer 20, and the system remains in this situation for at least 1 minute, preferably 15 minutes. The $H_2$ is dissociated into hydrogen atoms. The shutter 20 is closed and the $H_2$ gas flow is turned off. Subsequently a silicon-carrying gas, preferably silane, or gas mixture is admitted to the vacuum vessel 24 through gas inlet 25. After re-opening the shutter 28, now through dissociation of the silicon-carrying gas along the hot filament the actual deposition takes place of the semiconducting material that forms the channel region of the TFT.

It was surprisingly found by the inventors that by periodically isolating the substrate by means of opening and closing the shutter, a TFT with a consistent gate voltage and a desired saturation mobility was obtained. An advantage of a good saturation mobility is that the electrons can transfer at a higher rate, to yield more responsive TFT's.

The range in which the main deposition parameters are set are typically the following. Wafer temperature between 200 and 600° C., silane gas flow between 20 standard $cm^3$/minute and 150 standard $cm^3$/minute, vessel pressure between 15 microbar and 500 microbar, and the temperature of the tungsten filament between 1600° C. and 2000° C. Typically, it takes 2.5 minutes to form the α-Si:H layer.

Since the deposition temperature of the subsequent highly doped semiconducting layer is lower than that of the first semiconducting layer, the sample needs to cool down. The cooling of the sample is done with a continuous silane flow present through the vacuum vessel for about 15 minutes, with the filament turned off. The silane flow is used to prevent hydrogen atoms from desorbing form the grown α-Si:H film during the cooling.

After reaching the appropriate temperature, but prior to the deposition of the highly doped semiconducting layer, $H_2$ gas is admitted to the vessel 24 and a plasma is created for at least 1 minute, but preferably for 3 minutes. In order to make this possible, the vessel 24 is equipped with a radio frequency electrode 31 and radio frequency generator 33 in addition to the hot-filament assembly. The purpose of this plasma treatment is to passivate the surface dangling bonds and subsurface defects that remain in the deposited film after the silane gas treatment during cool down. The treatment with a $H_2$ plasma results in a good-quality, low resistance, electrical contact between the just deposited semiconducting layer and the subsequently highly doped semiconducting layer. After this treatment the sample is transported in vacuum to another vacuum vessel with methods known to those skilled in the art. In this next vessel the highly doped semiconducting layer is formed with a conventional 13.56 MHz glow discharge (not shown).

EXPERIMENTAL

EXAMPLE 1

Parameter settings:

filament temperature, 1750° C., pressure, 20 microbar, substrate temperature, 430° C., gas flow, 90 standard $cm^3$/minute.

The following procedure was followed:

Sample loaded in the process chamber 17:00 p.m.

Filaments turned on (shutter closed): 9:30 a.m. next day $H_2$ flow on, open shutter @ 10:15 a.m. for 15 minutes, close shutter $H_2$ flow off, $SiH_4$ flow on @ 10:30 a.m., open shutter $SiH_4$ flow on for 2 minutes and 30 seconds, close shutter Then filaments turned off Then 15 minutes continuous 40 sccm $SiH_4$ flow $SiH_4$ turned off, 20 sccm $H_2$ flow turned on Then rf turned on for 3 minutes ($H_2$ plasma)

Then chamber evacuated & sample transport to chamber for highly doped silicon deposition Then n' deposition for 11 minutes and 40 seconds Then sample taken out and put in Aluminum evaporator With conventional techniques the aluminum source (S), and drain (D) contacts were made and through conventional etch procedures the n' was removed from in between S & D.

The TFT obtained according to this experimental data yielded the current vs potential difference graph of FIG. 8.

Various data recorded during the growth of these TFT layers is shown in table 1 below.

the threshold voltage. The square-root of $I_s$ was then plotted versus $V_g$. From the slope of a linear fit to the straight part of this curve it was calculated, before gate bias stress, that $\mu_s$=0.75±0.05 $cm^2$/V·s whereas the abscissa was equal to $V_t$=7.8±0.3 V. After +25 V gate bias stress for 2.5 h the threshold voltage remained unchanged. The high value of $\mu_s$ indicated the high quality of this transistor.

Conventional state-of-the-art PECVD α-Si:H TFTs typically have $\mu_s$=0.4–0.8 $cm^2$/V·s and a comparable $V_t$ when $SiO_2$ is used as the gate dielectric. After similar gate bias stress conventional TFTs typically show a threshold voltage shift of +2 V or larger.

Polycrystalline Silicon TFTs

Using the same preparation method of the substrate, hydrogenated polycrystalline silicon, poly-Si:H layers were made, by simply changing the deposition parameters. Multilayer structures were also made in which the initial phase of the growth on the $SiO_2$ substrate was amorphous, which was then followed by formation of crystals with a preferred orientation perpendicular to the substrate's surface according to the present invention. Examples 2 and 3, below illustrate these.

TABLE 1

| TFT | | | | | |
|---|---|---|---|---|---|
| Run # P1251 | | | | Project: KNAW | |
| Date: 13-09-1996 | | | | Purpose: HW TFT | |
| Substrate; wafer no. 19 | | | | Cleaning: - | |
| Lamps [min]:5 | | | | Operator: KW | |
| Layer type | | 1' | | | n |
| MPZ# | 4 | 4 | 4 | 4 | 3 |
| El. distance [mm] | 30 × 40 | 30 × 40 | 30 × 40 | ~40 | 22 |
| Preheat | night +45 min with wires on | | | | Zero H55 |
| Prepressure [Torr] | 6E-07 | | | | 8E-09 |
| Deposition time | 15' | 2'30" | 15' | 3' | 11'40" |
| Est. thickness [nm] | — | 250 | — | — | 50 |
| flow Silane | | 90 | 40 | | 40 |
| flow Hydrogen | 20 | | | 20 | |
| flow Methane | | | | | |
| flow TMB | | | | | |
| flow Phosphine | | | | | 11 |
| flow | | | | | |
| Pressure [microbar] | 20 | 20 | 20 | 700 | 400 |
| Temperature (° C.) | 450 | 450 | 450 -> 440 | 440 | 230 HT |
| Generator used | | | | RFA | RFA |
| Power [W] | | | | 3 | 3 |
| Refl. power [W] | | | | 0.2 | 0.3 |
| Pot. position | | | | 1.00 | 1.01 |
| Frequency [MHz] | | | | 13.56 | 13.56 |
| Load | | | | 49 | 47 |
| Tune | | | | 12 | 12 |
| DC bias [V] | | | | −16 | −11 |
| Voltage [Y] | 16.5 | | | | |
| Current [A] | 14 | 14 | 0 | | |

The mobility in the TFT saturation regime was determined by measuring the source-drain current $I_s$ while, at all items during the measurement, the source-drain voltage $V_s$ was kept equal to the gate voltage $V_g$ ($V_s$=$V_g$). Then $I_s$ was approximated by $$I_g = \frac{W}{2L}\mu_g C_i (V_g - V_t)^2$$

with W the channel width, L the channel length, $\mu_s$ the saturation nobility, $C_i$ the gate insulator capacitance, and $V_t$

EXAMPLE 2

The following parameters were used to obtain poly-Si:H TFTs, with an amorphous incubation layer at the interface with the $SiO_2$:

$T_{wire}$=1900° C., $T_{set}$=648° C. (resulting in a pre-deposition substrate temperature of 430° C.), $\psi SiH_4$=10 sccm, $\psi H_2$=150 sccm, p=100 microbar.

For these TFTs a saturation mobility $\mu_a$ of 1.10±0.03 $cm^2$/V·s was calculated and a threshold voltage $V_t$ of 6.6±0.3 V. Within the experimental error, no threshold voltage shift was observed after 65 h of gate bias stress.

EXAMPLE 3

The following parameters were used to obtain purely intrinsic poly-Si:H without an amorphous incubation layer: $T_w=1830°$ C., $T_{set}=648°$ C. (resulting in a pre-deposition substrate temperature of 430° C.) $\psi SiH_4=0.8$ sccm, $\psi H_2=150$ sccm, p=100 microbar.

In TFTs which incorporate this material a saturation mobility $\mu_s$ between 2 and 100 cm²/V·s can be obtained. Since the channel region has no amorphous nature, after gate bias stress a threshold voltage shift is not to be expected.

What is claimed is:

1. Process for providing a layer for a semiconducting device including silicon, the process comprising the steps of:
   - loading a substrate in a vacuum chamber maintained at a vessel pressure between 15 and 500 microbars with said vacuum chamber including filaments being heated in the vacuum chamber to a predetermined dissociation temperature in the range of between 500–3000° C.;
   - providing a shutter in the vacuum chamber between said filaments and said substrate which is displaceable between an open condition and a closed condition;
   - introducing hydrogen gas into the vacuum chamber for a first predetermined time with the shutter in its said open position removed between said filaments and said substrate exposing said filaments to said substrate so that said hydrogen gas dissociates into fractions;
   - turning off the hydrogen gas and moving the shutter to its said closed position between said filaments and said substrate for a second predetermined time;
   - introducing silane or a mixture of silane and hydrogen into the vacuum chamber for a third predetermined time at a silane gas flow rate of between 20 standard cm³/minute and 150 standard cm³/minute and moving the shutter to its said open position, so that the silane or mixture of silane and hydrogen dissociates into fractions when exposed to the filaments such that a semiconducting layer comprising silicon is deposited onto the substrate; and
   - turning the filaments off and flowing silane through the vacuum chamber for a fourth predetermined time to cool the filaments down to ambient temperature.

2. Process according to claim 1 wherein the gas is heated by heat radiating from a heating element.

3. Process according to claim 2 wherein the heating element comprises a tungsten element.

4. Process according to claim 1, wherein the carrier is a silicon wafer.

5. Process according to claim 4, wherein the silicon wafer is thermally oxidized.

6. Process according to claim 1, wherein the carrier is made of glass.

7. Process according to claim 1, wherein the gas is a silicon containing gas.

8. Process according to claim 7, wherein the silicon containing gas comprises silane.

9. Process according to claim 1, wherein the filaments are heated to a temperature range of 1600–2000° C. and in the case of tungsten most preferably to a temperature of about 1750° C.

10. Process according to claim 1, wherein the substrate is pretreated with a treatment gas before deposition of the semiconducting layer is carried out.

11. Process according to claim 10, wherein the pretreatment gas comprises hydrogen, and wherein the substrate is preferably periodically protected therefrom by means of the displaceable, isolating shutter.

12. Process according to claim 1, carried out in a vacuum vessel.

13. Process according to claim 1, wherein the vacuum chamber is maintained at a pressure between 15 and 500 microbars, and most preferably at a pressure of 20 microbars.

14. Process according to claim 1, wherein the silane gas flows through the vacuum vessel at a rate of approximately 90 standard cm³/minute.

15. Process according to claim 1, wherein the substrate is heated to a temperature of between 200 and 600° C., preferably to a temperature of between 400 and 450° C. and most preferably to a temperature of 430° C.

16. Process according to claim 1, wherein following deposition of the semiconducting layer, the device is cooled.

17. Process according to claim 16 wherein the device is cooled by guiding silane gas through the vacuum vessel.

18. Process according to claim 16, whereafter a highly doped semiconducting layer is deposited on the semiconducting layer.

19. Process according to claim 18, wherein the highly doped semiconducting layer is deposited by means of radiofrequency glow discharge.

20. Process according to claim 19, wherein prior to the deposition of the highly doped semiconducting layer, the surface bonds of the deposited semiconducting layer are passivated, preferably by treating these with $H_2$ plasma.

21. Processing according to claim 1, comprising the further steps of:
   - introducing hydrogen gas into the vacuum chamber, and subsequently turning radio frequency power on to create a hydrogen plasma during a third predetermined time while the shutter is in the second open position; and
   - closing the shutter and switching the radio frequency power off.

* * * * *